United States Patent
Rohilla

(10) Patent No.: US 6,980,575 B1
(45) Date of Patent: Dec. 27, 2005

(54) TOPOLOGY ON VCSEL DRIVER

(75) Inventor: Gajender Rohilla, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 651 days.

(21) Appl. No.: 09/801,409

(22) Filed: Mar. 8, 2001

(51) Int. Cl.[7] ............................................... H01S 3/00
(52) U.S. Cl. ............... 372/38.02; 372/38.1; 372/38.03; 372/38.07
(58) Field of Search ............... 372/38.02, 38.03, 372/38.07, 38.04, 38.1, 26, 29.012, 29.015, 372/29.021

(56) References Cited

U.S. PATENT DOCUMENTS

| | | | | |
|---|---|---|---|---|
| 4,709,370 | A | * | 11/1987 | Bednarz et al. ............ 372/38.02 |
| 5,132,553 | A | * | 7/1992 | Siegel ......................... 307/270 |
| 5,802,089 | A | * | 9/1998 | Link ........................... 372/38.02 |
| 5,883,910 | A | * | 3/1999 | Link ........................... 372/38.07 |
| 6,236,671 | B1 | * | 5/2001 | Babic .......................... 372/50 |
| 6,272,160 | B1 | * | 8/2001 | Stronczer ................... 372/38.02 |
| 6,618,406 | B1 | * | 9/2003 | Kaminishi .................. 372/38.02 |
| 2002/0110167 | A1 | * | 8/2002 | Patterson, III ............ 372/38.02 |

OTHER PUBLICATIONS

MAXIM; http://dbserv.maxim-ic.com/quick_view2.cfm?pdf_num=1072; Jan. 24, 2001.

* cited by examiner

*Primary Examiner*—Minsun Oh Harvey
*Assistant Examiner*—Armando Rodriguez
(74) *Attorney, Agent, or Firm*—Marger Johnson & McCollom, P.C.

(57) ABSTRACT

The present invention provides a circuit capable of driving a diode with multiple amounts of current with a low supply voltage without the requirement of alternating current coupling. The circuit provides for headroom voltage for the current sources allowing them to operate correctly without the requirement of external components such as inductors to provide coupling. The circuit may provide one of at least two different amounts of current depending upon the voltage of at least two inputs suitable for driving a vertical cavity surface emitting laser diode.

19 Claims, 3 Drawing Sheets

US 6,980,575 B1

TOPOLOGY ON VCSEL DRIVER

FIELD OF THE INVENTION

The present invention relates generally to driver circuits and more specifically to an improved driver circuit for a vertical cavity surface emitting laser (VCSEL) diode.

BACKGROUND OF THE INVENTION

Vertical Cavity Surface Emitting Laser (VCSEL) diodes are typically utilized to transmit digital data over optical fibers. Driver circuits are utilized to deliver current through the VCSEL diode. When 0s are being transmitted, a threshold current is driven through the VCSEL diode. This threshold current is referred to by those skilled in the art as the bias current. When 1s are transmitted, a larger current than the bias current is passed through the VCSEL diode, the additional amount of current being referred to as modulation current.

A problem with driver circuits known to the art is the lack of headroom voltage for a current source. Typical VCSEL diodes are modeled as forward voltage of around 1.6 volts with a series resistance of approximately 20 Ohms. With a maximum amount of current allowed to flow through the diode at 20 milliAmperes, the voltage drop across the diode is approximately 2 Volts. A one-volt voltage drop occurs at a transistor when in the forward active region. In driver circuits with a power supply of about three volts known to the art, a two-volt voltage drop across the diode and a one-volt voltage drop across the transistor does not permit any headroom voltage for a current source placed in series with the diode and transistor. A method to ameliorate the lack of headroom voltage in three-volt driver circuits known to the art is to provide alternating current (AC) coupling. AC coupling requires external components which may not be suitable for placement upon a chip, such as inductors and capacitors.

Consequently, it would be advantageous if a system and method of driving a semiconductor diode existed which could provide additional headroom voltage for low voltage supplies. It would also be advantageous if a system and method existed which could drive a semiconductor diode with a low voltage supply without AC coupling.

SUMMARY OF THE INVENTION

Accordingly, the present invention is directed to a system of driving a semiconductor diode at low voltages without the requirement of AC coupling. Further, the present invention is directed to a system capable of driving a semiconductor diode while providing additional headroom voltage while the entire system is capable of being placed upon a single chip.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made to a presently preferred embodiment of the invention, an example of which is illustrated in the accompanying drawings.

Figure 1:
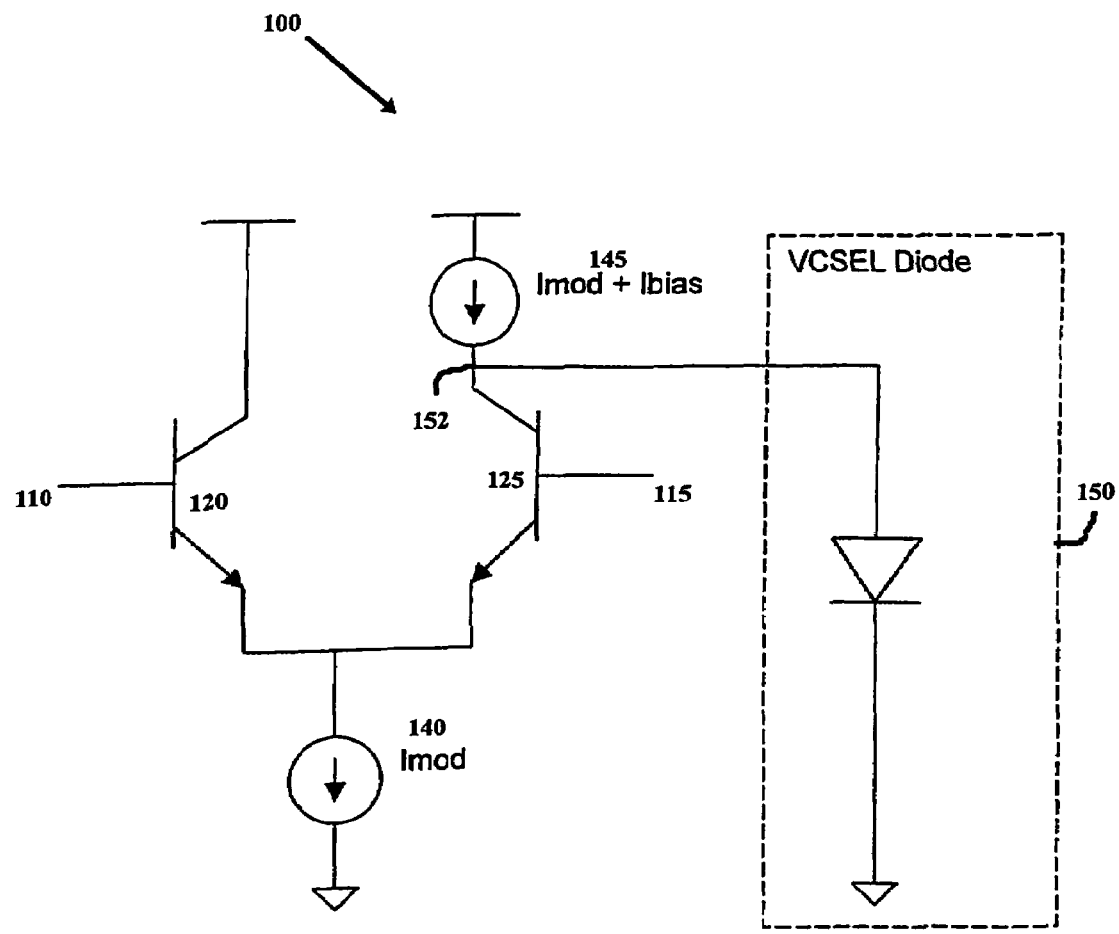
FIG. 1 depicts an exemplary embodiment of driver circuit of the present invention.

Referring now to FIG. 1, an exemplary embodiment of a system 100 driving a semiconductor diode in accordance with the present invention is shown. The system 100 of the present invention may be suitable for driving a vertical cavity surface emitting laser (VCSEL) diode, for example. Driver circuits may be utilized with VCSEL diodes to control the amount of current passing through the diode.

The system which may be in the form of a circuit may include first and second inputs 110,115 along with a first and second transistor 120,125. The voltage of the first and second inputs 110, 115 respectively may determine whether the VCSEL diode transmits 0s or 1s. In an embodiment of the invention, the first and second transistors may be bipolar transistors. However, other types of transistors such as metal-oxide-silicon transistors may be utilized by one of ordinary skill in the art without departing from the scope and spirit of the present invention.

The first input 110 may be connected to the base of the first transistor 120. The emitter of the first transistor 120 may be connected to a first current source 140 capable of producing a modulation current. The second input 115 may be connected to the base of the second transistor 125. The current source 140 may be connected to the emitter of the second transistor 125. The collector of the second transistor 125 is connected to a second current source 145 capable of generating an amount of current equal to modulation current and bias current. A VCSEL diode 150 may also be connected to the collector of the second transistor 125.

In an embodiment of the present invention, VCSEL diode 150 may be modeled as forward voltage of 1.6 volts with a series resistance of 20 Ohms. With a maximum current (modulation current plus bias current) passing through the diode of 20 milliAmperes, the voltage across the diode may be 2 volts. With a low voltage power supply, a power supply of about three volts for example, one volt of headroom may be may be created by removing the one volt voltage drop across the active transistor which is typical is driver circuits known to the art. A volt of headroom may be available for the current sources in order to ensure proper operation.

Figure 2:
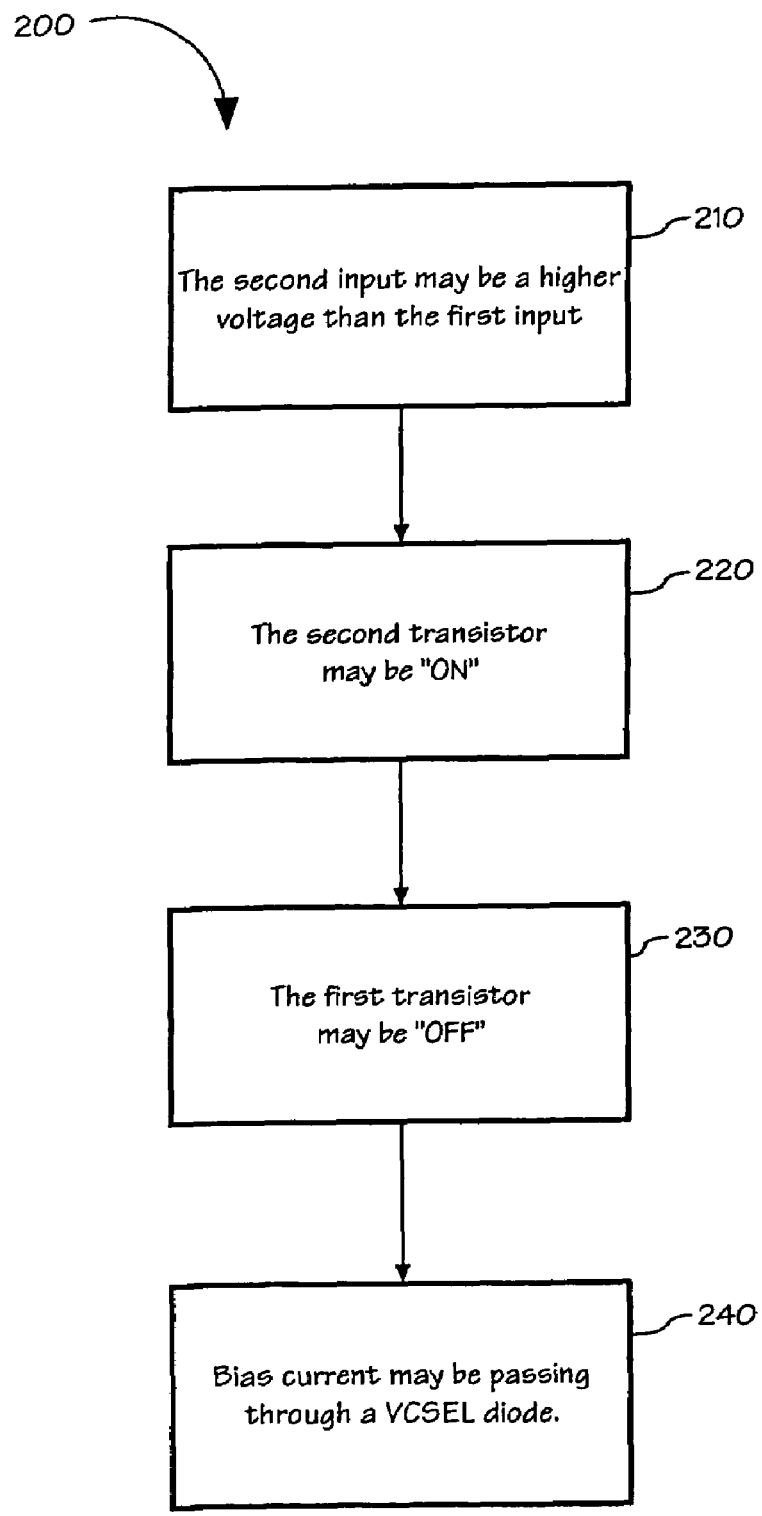
FIG. 2 depicts an exemplary embodiment of a flow chart depicting operation of the driver circuit of the present invention when 0s are transmitted.

Turning to the operation of the driver circuit of the present invention, an exemplary flow chart depicting the process as 0s are transmitted 200 is shown in FIG. 2. When transmission of 0s is desired, the second input 115 may be a higher voltage than the first input 210. This may cause the second transistor to be "on" 220 while the first transistor is "off" 230. When the first transistor is off, current may not pass through the first transistor. As a result, modulation current may pass through the second transistor because it is on. As there is modulation current flowing out of the transistor and modulation plus bias current flowing out of node 152 (FIG. 1), bias current may be passing through the VCSEL diode 240.

Figure 3:
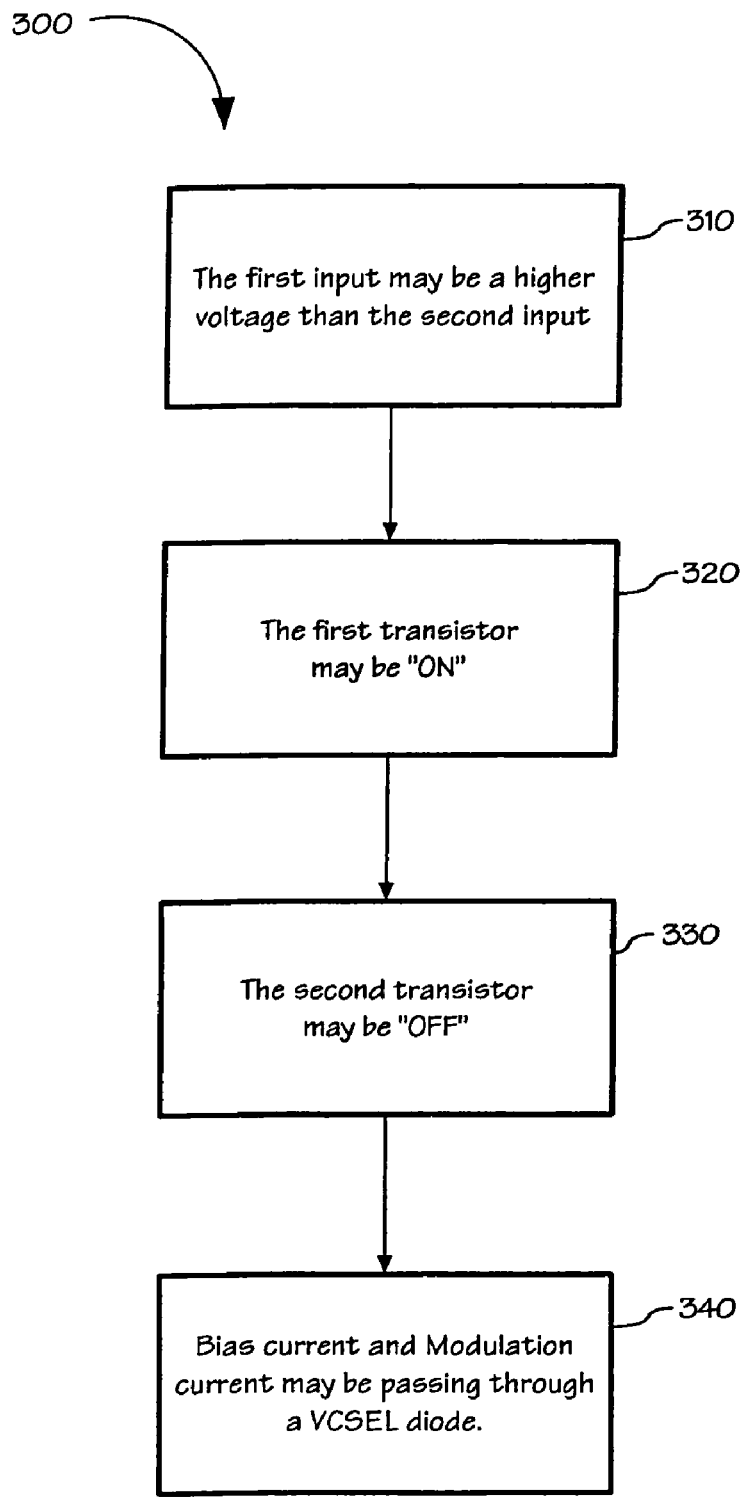
FIG. 3 depicts an exemplary embodiment of a flow chart depicting operation of the driver circuit of the present invention when 1s are transmitted.

Referring now to FIG. 3, an exemplary embodiment of a flow chart depicting operation of the driver circuit of the present invention when 1s are transmitted 300 is shown. The first input may be a higher voltage than the second input. This may cause the first transistor to go "on" 320 while the second transistor may go "off" 330. With no current passing through the second transistor, modulation plus bias current may pass through the VCSEL diode.

Although the invention has been described with a certain degree of particularity, it should be recognized that elements thereof may be altered by persons skilled in the art without departing from the spirit and scope of the invention. It is believed that the method and system for the present invention and many of its attendant advantages will be understood by the foregoing description, and it will be apparent that various changes may be made in the form, construction, and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A method for driving a diode, comprising:
   providing a power supply input voltage up to about three volts;
   selecting an amount of current from at least two amounts of current to flow through a diode based upon a voltage of at least two input values;
   directing said selected amount of current to flow through said diode; wherein at least two current sources are provided with a headroom voltage sufficient to produce said at least two amounts of current without being connected to an alternating current coupling circuit.

2. The method as claimed in claim 1, wherein said method is capable of driving a vertical cavity surface emitting laser diode.

3. The method as claimed in claim 1, wherein a first current source of said at least two current sources produces an amount of current substantially equal to one of said at least two amounts of current selected.

4. The method as claimed in claim 1, wherein said selecting one of said at least two amounts of current is accomplished by a pair of transistors operating as a differential switch.

5. A circuit for providing a semiconductor laser drive current, comprising:
   a power supply input voltage up to about three volts;
   a differential switch for selecting one of at least two amounts of current depending upon the voltage of each of at least two inputs; the differential switch including a pair of transistors; and
   at least two current sources, one of the at least two current sources configured to generate a modulation current, another one of the at least two current sources configured to generate a current equal to the modulation current plus a bias current, the at least two current sources capable of producing the at least two amounts of current by at least one of independent and combined operation, wherein a headroom voltage for the at least two current sources is obtained by the amount of voltage provided by the input voltage less a voltage drop across a device being driven by the one of at least two amounts of current and a voltage drop across said pair of transistors during operation of said circuit.

6. The circuit as claimed in claim 5, wherein said pair of transistors are bipolar transistors.

7. The circuit as claimed in claim 5, wherein approximately a volt of headroom voltage is obtained by the amount of voltage provided by said input voltage less a voltage drop across said device being driven by said selected current and a voltage drop across said pairs of transistors during operation of said circuit.

8. A circuit, comprising:
   at least two inputs;
   a first transistor connected to a first input of said at least two inputs;
   a second transistor connected to a second input of said at least two inputs;
   a first current source connected to said first and second transistors and configured to generate a first amount of current; and
   a second current source connected to said second transistor and configured to generate a second amount of current, wherein the second amount of current and a third amount of current substantially equal to the second amount of current less the first amount of current is configured to be delivered to a device, the circuit configured to drive the device with a voltage supply of three volts or less without alternative current coupling.

9. The circuit as claimed in claim 8, wherein the second amount of current is delivered to said device when said first input is a higher voltage than said second input.

10. The circuit as claimed in claim 8, wherein said third amount of current is delivered to said device when said second input is a higher voltage than said first input.

11. The circuit as claimed in claim 8, wherein said first and second transistors are bipolar transistors.

12. The circuit as claimed in claim 8, wherein said first input is connected to a base of said first transistor.

13. The circuit as claimed in claim 8, wherein said second input is connected to a base of said second transistor.

14. The circuit as claimed in claim 8, wherein said first current source is connected to an emitter of each of said first and second transistors.

15. The circuit as claimed in claim 8, wherein said second current source is connected to a collector of said second transistor.

16. The circuit as claimed in claim 8, wherein said device is a vertical cavity surface emitting laser diode.

17. A circuit for providing a semiconductor laser drive current, comprising:
   means for providing a power supply input voltage, said power supply input voltage up to about three volts;
   means for selecting an amount of current from at least two amounts of current to flow through a diode; said selecting means being capable of analyzing the voltage of each of at least two inputs;
   means for generating said at least two amounts of current, wherein said generating means is provided with a headroom voltage sufficient for generating said at least two amounts of current without said circuit being connected with an alternating current coupling circuit; and
   means for directing said selected amount of current to flow through said diode.

18. The method as claimed in claim 4, wherein said pair of transistors are bipolar transistors.

19. The circuit as claimed in claim 16, wherein said vertical cavity surface emitting laser diode is connected to a collector of said second transistor.

* * * * *